（12）United States Patent
Hageman et al.

(10) Patent No.: US 7,482,868 B2
(45) Date of Patent: Jan. 27, 2009

(54) DUAL MODE POWER AMPLIFIER

(75) Inventors: Michael L. Hageman, Mt. Vernon, IA (US); Dale R. Brandt, Central City, IA (US); David S. Ripley, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 129 days.

(21) Appl. No.: 11/259,006

(22) Filed: Oct. 25, 2005

(65) Prior Publication Data

US 2007/0096810 A1 May 3, 2007

(51) Int. Cl.
*H03G 5/16* (2006.01)
(52) U.S. Cl. .................... 330/133; 330/124 R; 330/302
(58) Field of Classification Search ............. 330/124 R, 330/133, 134, 295, 296, 302, 310, 285
See application file for complete search history.

(56) References Cited

U.S. PATENT DOCUMENTS

| 6,782,244 | B2 * | 8/2004 | Steel et al. ............... 455/127.1 |
| 6,970,040 | B1 * | 11/2005 | Dening ....................... 330/126 |
| 7,123,096 | B2 * | 10/2006 | Selin ........................... 330/295 |
| 2007/0080750 | A1 * | 4/2007 | Liebenrood .................. 330/252 |

* cited by examiner

*Primary Examiner*—Khanh V Nguyen

(57) ABSTRACT

A power amplifier is configured to operate in a first gain mode and a second gain mode. A first power amplifier input stage has an input and an output. A second power amplifier input stage has an input and an output, where the output of the second power amplifier input stage is coupled to the output of the first power amplifier input stage. The first input stage is turned on in response to a first bias voltage in the first gain mode and the second input stage is turned on in response to a second bias voltage in the second gain mode. Alternatively, a first input stage and an intermediate stage can be switched off by turning off their respective bias voltages, and a second input stage can be switched on by turning on its respective bias voltage; the intermediate stage and the second input stage sharing a common output.

24 Claims, 5 Drawing Sheets

US 7,482,868 B2

DUAL MODE POWER AMPLIFIER

BACKGROUND OF THE INVENTION

1. Field of the Invention

The present invention is generally in the field of electrical circuits. More particularly, the invention is in the field of power amplifiers.

2. Background Art

A power amplifier used in a wireless communication device, such as a cellular handset, is required to have a gain that matches the communication standard of the system under which the device operates and the type of signal modulation that the system uses. For example, a power amplifier used in cellular handset operating a system using a global system for mobile communications ("GSM") communications standard and Gaussian minimum shift keying ("GMSK") modulation requires a different gain than a power amplifier used in a cellular handset in a system using an enhanced data for global evolution ("EDGE") communications standard and EDGE modulation. Thus, to enable a wireless communication device, such as a cellular handset, to operate in two different systems that use different modulation types, a power amplifier is required to provide an appropriate gain for each system and modulation type.

In one approach, a power amplifier having three amplifier stages achieves a low gain mode by closing a switch to connect the input and output of a power amplifier input stage together, thereby reducing the three-stage amplifier to a two-stage amplifier. In the above approach, a high gain mode can be achieved by opening the switch to provide three stages of amplification. However, the switch utilized in above approach typically requires a number of additional components, such as blocking capacitors and inductors, for proper implementation, which undesirably increases manufacturing cost.

Also, the switch can cause undesirable signal loss in the low gain mode, which can be offset by additional amplification. However, the additional amplification required to offset the signal loss can undesirably increase the noise level in the power amplifier. Also, as effective switch may require a separate semiconductor die for fabrication, which significantly increases manufacturing cost.

Thus, there is a need in the art for a cost-effective power amplifier that can selectively operate in a low gain mode or a high gain mode.

SUMMARY OF THE INVENTION

The present invention is directed to a dual mode power amplifier. The present invention addresses and resolves the need in the art for a cost-effective power amplifier that can selectively operate in a low gain mode or a high gain mode.

According to an exemplary embodiment, an amplification module includes a power amplifier configured to operate in a first gain mode and a second gain mode. The power amplifier can be further configured to operate as a linear power amplifier in the first gain mode and to operate as a saturated power amplifier in the second gain mode. The power amplifier can be fabricated on a single semiconductor die. The power amplifier includes a first power amplifier input stage having an input and an output. The power amplifier further includes a second power amplifier input stage having an input and an output, where the output of the second power amplifier input stage is coupled to the output of the first power amplifier input stage. For example, the output of the second power amplifier input stage can be directly connected to the output of the first power amplifier input stage.

According to this exemplary embodiment, the first power amplifier input stage is turned on in response to a first bias voltage in the first gain mode and the second power amplifier input stage is turned on in response to a second bias voltage in the second gain mode. The first power amplifier input stage can have a first gain and the second power amplifier input stage can have a second gain, where the second gain is greater than the first gain. The power amplifier can further include a power amplifier intermediate stage having an input connected to the outputs of the first and second power amplifier input stages. The power amplifier can further include a power amplifier output stage having an input and an output, where the input of the power amplifier output stage is connected to the output of the power amplifier intermediate stage and the output of the power amplifier output stage provides an RF output signal.

In another embodiment, a first input stage and an intermediate stage can be switched off by turning off their respective bias voltages, and a second input stage can be switched on by turning on its respective bias voltage. In this embodiment, the intermediate stage and the second input stage share a common output. Other features and advantages of the present invention will become more readily apparent to those of ordinary skill in the art after reviewing the following detailed description and accompanying drawings.

DETAILED DESCRIPTION OF THE INVENTION

The present invention is directed to a dual mode power amplifier. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
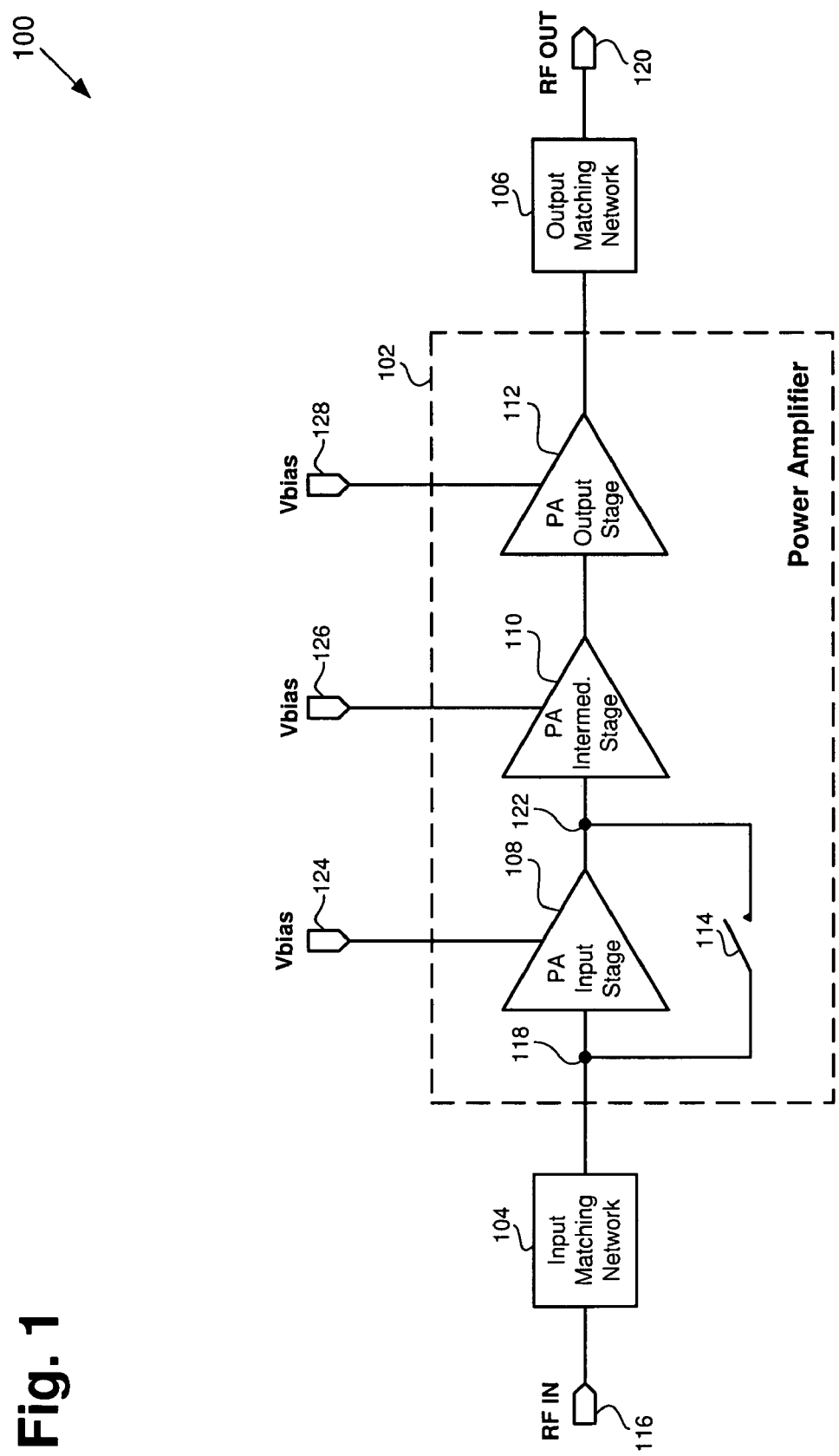
FIG. 1 is a block diagram of a conventional exemplary amplification module including a conventional exemplary power amplifier.

FIG. 1 shows a block diagram of an exemplary conventional amplification module including an exemplary conventional power amplifier. Conventional amplification module 100 includes conventional power amplifier 102, input matching network 104, and output matching network 106. Conventional power amplifier 102 includes power amplifier input stage 108, power amplifier intermediate stage 110, power amplifier output stage 112, and switch 114. Conventional amplification module 100 can be used in wireless communication devices, such as cellular handsets, operating in, for example, a GSM system or an EDGE system.

As shown in FIG. 1, RF input signal ("RF IN") 116 is coupled to the input of power amplifier input stage 108 of conventional power amplifier 102 at node 118 via input matching network 104. Input matching network 104 can be configured to match the output impedance of a circuit (not shown in FIG. 1) that provides RF IN 116 to the input impedance of power amplifier input stage 108. Conventional power amplifier 102 can be configured to receive and amplify RF IN 116 and generate RF output signal ("RF OUT") 120. Conventional power amplifier 102 can also be configured to operate in a low gain mode and a high gain mode. In the low gain mode, power amplifier input stage 108 is bypassed by switch 114, which couples RF IN 116 to the input of power amplifier intermediate stage 110. In the high gain mode, power amplifier input stage 108 is not bypassed and RF IN 116 is coupled to the input of first power amplifier stage 110.

Also shown in FIG. 1, a first terminal of switch 114 is coupled to node 118 (i.e. the input of power amplifier input stage 108) and a second terminal of switch 114 is coupled to the output of power amplifier input stage 108 and the input of power amplifier intermediate stage 110 at node 122. Switch 114 can be configured to be open or closed in a respective high or low gain mode of conventional power amplifier 102. Switch 114 can comprise a diode switch, a field effect transistor ("FET") switch, or a discrete component. Switch 114 also requires a number of blocking components (not shown in FIG. 1), such as blocking capacitors and inductors, for proper implementation, which undesirably increases manufacturing cost. Also, switch 114 causes signal loss when it (i.e. switch 114) is closed in the low gain mode. Although this signal loss can be offset by increasing the gain in power amplifier intermediate stage 110 and/or power amplifier output stage 112, the increased gain can undesirably increase noise in conventional power amplifier 102.

Power amplifier intermediate stage 110 can be configured to receive an RF signal at node 122, amplify the RF signal, and output the amplified RF signal. Further shown in FIG. 1, power amplifier output stage 112 can be configured to receive and amplify the RF signal outputted by power amplifier intermediate stage 110 and provide RF OUT 120. Also shown in FIG. 1, the output of power amplifier output stage 112, which is also referred to as the output of power amplifier 102, is coupled to output matching network 106, which couples the output of power amplifier output stage 112 to a load (not shown in FIG. 1), such as an antenna. Further shown in FIG. 1, bias voltages ("Vbias") 124, 126, and 128 are coupled to the bias inputs of power amplifier input stage 108, power amplifier intermediate stage 110, and power amplifier output stage 112, respectively.

Thus, in a high gain mode, switch 114 is open to allow conventional power amplifier 102 to utilize three power amplifier stages (i.e. power amplifier input stage 108, power amplifier intermediate stage 110, and power amplifier output stage 112). In a low gain mode, switch 114 is closed to bypass power amplifier input stage 108 such that conventional power amplifier 102 utilizes only power amplifier intermediate stage 110 and power amplifier output stage 112. Thus, conventional power amplifier 102 requires switch 114 to selectively operate in a high gain mode or a low gain mode. However, as discussed above, switch 114 can cause undesirable signal loss in the low gain mode and require a number of blocking components for proper implementation, which increases manufacturing cost.

Figure 2A:
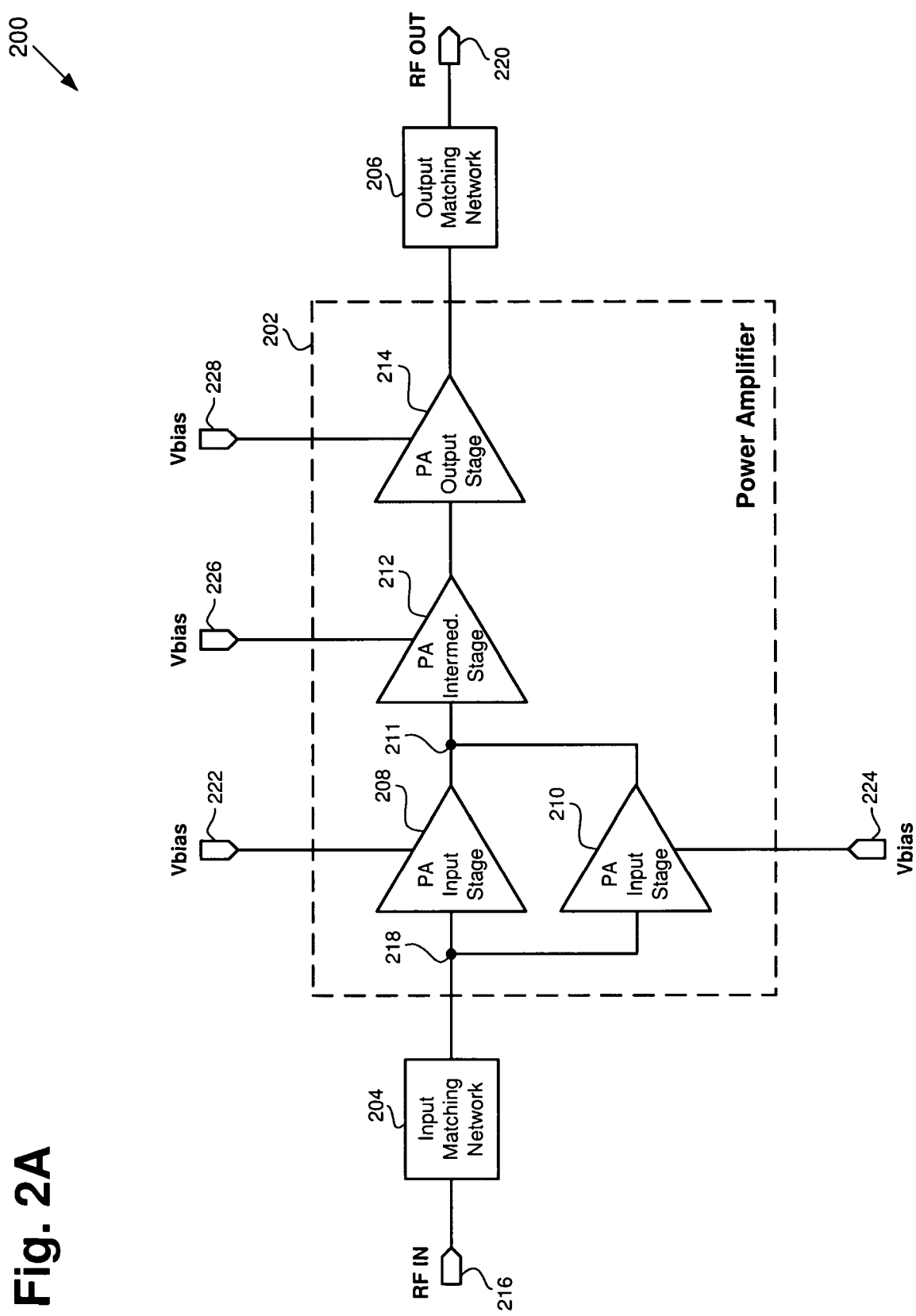
FIG. 2A is a block diagram of an exemplary amplification module including an exemplary power amplifier in accordance with one embodiment of the present invention.

FIG. 2A shows a block diagram of an exemplary amplification module including an exemplary power amplifier in accordance with one embodiment of the present invention. Certain details and features have been left out of FIG. 2A, which are apparent to a person of ordinary skill in the art. Amplification module 200 includes power amplifier 202, input matching network 204, and output matching network 206. Power amplifier 202 includes power amplifier input stage 208, power amplifier input stage 210, power amplifier intermediate stage 212, and power amplifier output stage 214. In one embodiment, power amplifier 202 may not include power amplifier intermediate stage 212. In other embodiments, it may include more than one power amplifier intermediate stage. Amplification module 200 can be used in wireless communication devices, such as cellular handsets, in systems using GSM, EDGE, code-division multiple access ("CDMA"), wideband CDMA ("WCDMA"), or other appropriate wireless communication standards.

As shown in FIG. 2A, RF input signal ("RF IN") 216 is coupled to the RF input of power amplifier 202 at node 218 via input matching network 204. Input matching network 204 can be configured to match the output impedance of a circuit (not shown in FIG. 2A) that provides RF IN 216 to the input impedance of power amplifier 202 at node 218. Power amplifier 202 can be configured to receive and amplify RF IN 216 and generate RF output signal ("RF OUT") 220. Power amplifier 202 can also be configured to operate in either a first gain mode, where power amplifier input stage 208 is turned on by Vbias 222, or a second gain mode, where power amplifier input stage 210 is turned on by Vbias 224. The first gain mode can be a low gain mode and the second gain mode can be a high gain mode, for example.

Power amplifier 202 can further be configured to operate in either a linear mode or a saturated mode as required by the particular system power amplifier 202 is operating in and the modulation type that the system is using. By way of example, power amplifier 202 can be configured to operate in a saturated mode in a GSM system using GMSK modulation. By way of further example, power amplifier 202 can be configured to operate in a linear mode in an EDGE system using EDGE modulation. Power amplifier 202 can be fabricated on a single semiconductor die using gallium arsenide ("GaAs") technology, Bipolar Complementary-Metal-Oxide-Semiconductor ("BiCMOS") technology, or other appropriate technologies.

Further shown in FIG. 2A, the input of power amplifier input stage 208 is coupled to input of power amplifier input stage 210 at node 218. The inputs of power amplifier input stages 208 and 210 can be coupled together using a passive network (not shown in FIG. 2A), for example. As shown in FIG. 2A, the output of power amplifier input stage 208 is directly connected to the output of power amplifier input stage 210 at node 211. In other words, the outputs of power amplifier input stages 208 and 210 are connected together such that DC current can flow between them. In another embodiment, the output of power amplifier input stage 208 can be AC coupled to the output of power amplifier input stage 210 to prevent DC current flow.

Also shown in FIG. 2A, Vbias 222 is coupled to the bias input of power amplifier input stage 208 and Vbias 224 is coupled to the bias input of power amplifier input stage 210. Vbias 222 can be turned on to turn on (i.e. activate) power amplifier input stage 208 and Vbias 224 can be turned on to turn on (i.e. activate) power amplifier input stage 210. However, Vbias 222 and Vbias 224 are not turned on at the same time. Power amplifier input stage 208 can be configured to receive and amplify RF IN 216 and generate an RF output signal when power amplifier input stage 208 is turned on by Vbias 222. Analogously, power amplifier input stage 210 can be configured to receive and amplify RF IN 216 and generate an RF output signal when power amplifier input stage 210 is turned on by Vbias 224. Power amplifier input stage 208 can have a lower gain than power amplifier input stage 210 such that power amplifier input stage 208 is turned on when power amplifier 202 is in a low gain mode and second power amplifier stage 210 is turned on when power amplifier 202 is in a high gain mode.

Thus, Vbias 222 can turn on power amplifier input stage 208 when power amplifier 202 is in the low gain mode and Vbias 224 turns on power amplifier input stage 210 when power amplifier 202 is in the high gain mode. Thus, in the present embodiment, Vbias 222 can be turned on to select a low gain mode of power amplifier 202 by turning on power amplifier input stage 208 and Vbias 224 can be turned on to select a high gain mode of power amplifier 202 by turning on power amplifier input stage 210.

Also shown in FIG. 2A, the input of power amplifier intermediate stage 212 is coupled to the outputs of first power amplifier stages 208 and 210 at node 211 and the output of power amplifier intermediate stage 212 is coupled to the input of power amplifier output stage 214. Power amplifier intermediate stage 212 can be configured to receive an RF signal at node 211, amplify the RF signal, and generate an RF output signal. Further shown in FIG. 2A, Vbias 226 is coupled to a bias voltage input of power amplifier intermediate stage 212. Also shown in FIG. 2A, the input of power amplifier output stage 214 is coupled to the output of power amplifier intermediate stage 212 and the output of power amplifier output stage 214, which is also referred to as the output of power amplifier 202, is coupled to output matching network 206.

Power amplifier output stage 214 can be configured to receive an RF signal outputted by power amplifier intermediate stage 212, amplify the RF signal, and generate RF OUT 220. Also shown in FIG. 2A, Vbias 228 is coupled to a bias voltage input of power amplifier output stage 214. Further shown in FIG. 2A, output matching network 206 couples the output of power amplifier output stage 214 to a load (not shown in FIG. 2A), such as an antenna. Output matching network 206 transforms the load impedance (not shown in FIG. 2A) to a desired power amplifier output stage load line. In power amplifier 202, power amplifier input stages 208 and 210 are independent of power amplifier intermediate stage 212 and power amplifier output stage 214. Thus, for example, power amplifier input stage 208 and/or power amplifier input stage 210 may have a greater gain than power amplifier intermediate stage 212.

The operation of power amplifier 202 will now be discussed for a configuration where the gain of power amplifier input stage 210 is greater than the gain of power amplifier input stage 208. In a low gain mode, Vbias 222 is turned on, which turns on power amplifier input stage 208, and Vbias 224 is turned off, which turns off power amplifier input stage 210. Thus, in the low gain mode, RF IN 216 is amplified by power amplifier input stage 208 and power amplifier 202 outputs RF OUT 220. In a high gain mode, Vbias 224 is turned on, which turns on power amplifier input stage 208, and Vbias 222 is turned off, which turns off power amplifier input stage 210. Thus, in the high gain mode, RF IN 216 is amplified by power amplifier input stage 210 and power amplifier 202 outputs RF OUT 220. Thus, by appropriately turning on either Vbias 222, which activates power amplifier input stage 208, or Vbias 224, which activates power amplifier input stage 210, a respective low gain mode or high gain mode can be selected.

Thus, in the embodiment in FIG. 2A, the present invention provides a power amplifier that can operate in either a low gain mode or a high gain mode by appropriately turning on one of two bias voltages to activate one of two power amplifier input stages, which have inputs coupled to a common node and outputs directly connected together. Thus, in contrast to conventional power amplifier 102 in FIG. 1, power amplifier 202 can selectively operate in a low gain mode or a high gain mode without requiring a switch to select a low gain mode or a high gain mode, as required in conventional power amplifier 102 in FIG. 1. Thus, in contrast to conventional power amplifier 102, power amplifier 202 does not have undesirable switch related signal loss in the low gain mode.

Additionally, power amplifier 202 requires fewer blocking components compared to conventional power amplifier 102, which advantageously reduces manufacturing cost. Furthermore, by utilizing separate power amplifier input stages in low gain and high gain modes in the embodiment in FIG. 2A, the present invention provides increased flexibility in achieving a desired overall power amplifier gain. In contrast, conventional power amplifier 102 bypasses the power amplifier input stage in a low gain mode, which undesirably reduces the flexibility in achieving a desired overall power amplifier gain by eliminating one power amplifier stage.

Figure 2B:
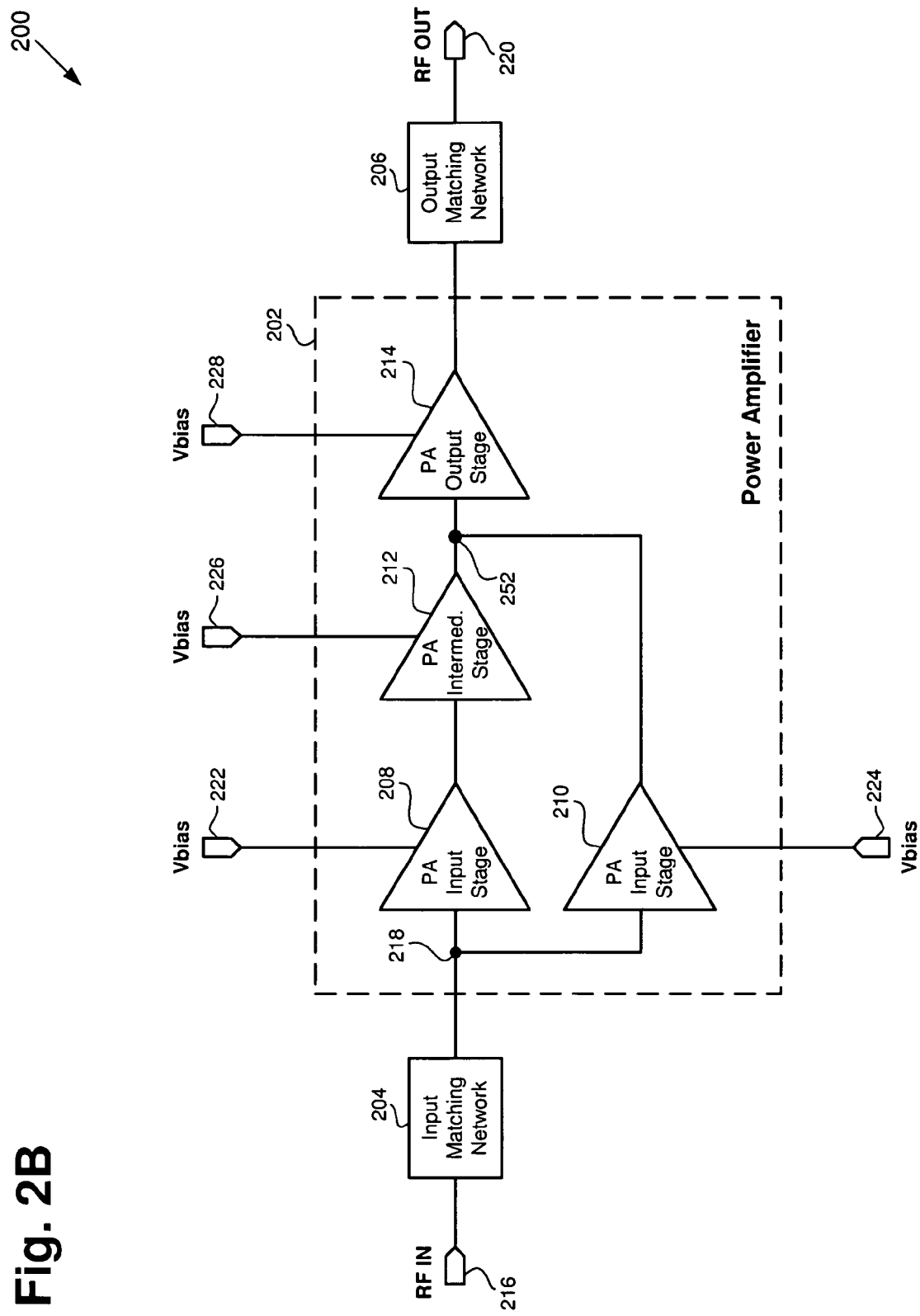
FIG. 2B is a block diagram of an exemplary amplification module including an exemplary power amplifier in accordance with one embodiment of the present invention.

FIG. 2B shows another embodiment of the invention, analogous to the embodiment in FIG. 2A. In the embodiment shown in FIG. 2B, in contrast with the embodiment of FIG. 2A, output of power amplifier input stage 210 is not coupled to output of power amplifier input stage 208. Instead, output of power amplifier input stage 210 is coupled to output of power amplifier intermediate stage 212 at node 252. In addition to all the advantages described above with respect to the embodiment of FIG. 2A, in the embodiment of FIG. 2B, power amplifier 202 can be converted from a three stage amplifier to a two stage amplifier. More generally, two stages in power amplifier 202 can be converted to a single stage, resulting in a power amplifier with one fewer stage. Similar to the embodiment in FIG. 2A, input stage 208 and intermediate stage 212 can be switched off by turning off Vbias 222 and Vbias 226, while input stage 210 can be turned on by turning on Vbias 224. Thus, in addition to the advantages described in relation to the embodiment of FIG. 2A, the embodiment of FIG. 2B will result in additional flexibility in that a power amplifier with one fewer gain stage is created, thus providing additional control over the gain characteristics of the power amplifier.

Figure 3A:
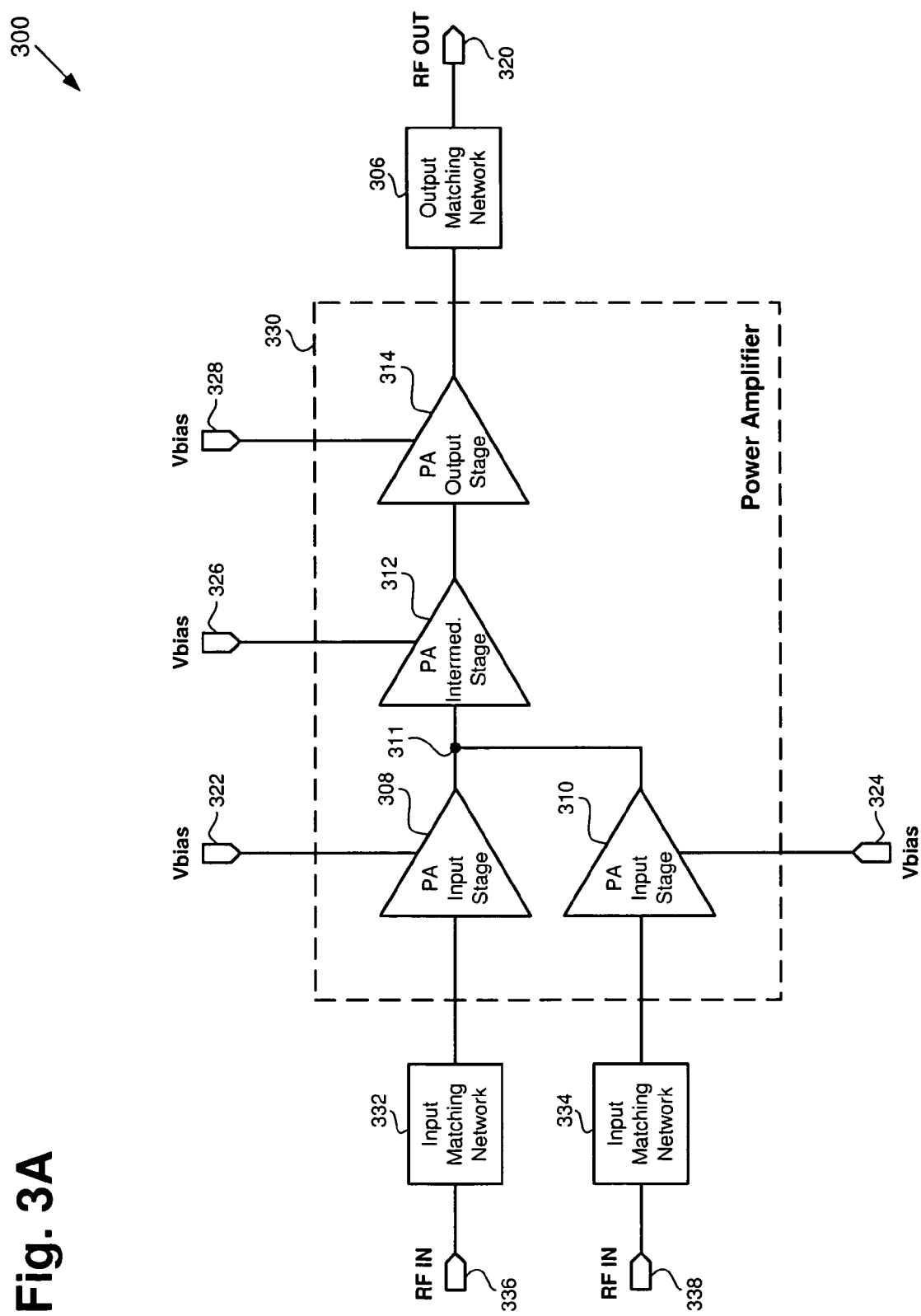
FIG. 3A is a block diagram of an exemplary amplification module including an exemplary power amplifier in accordance with another embodiment of the present invention.

FIG. 3A shows a block diagram of an exemplary amplification module including an exemplary power amplifier in accordance with one embodiment of the present invention. Certain details and features have been left out of FIG. 3A, which are apparent to a person of ordinary skill in the art. Output matching network 306, power amplifier input stages 308 and 310, power amplifier intermediate stage 312, power amplifier output stage 314, RF OUT 320, and Vbiases 322, 324, 326, and 328 in FIG. 3A correspond, respectively, to output matching network 206, power amplifier input stages 208 and 210, power amplifier intermediate stage 212, power amplifier output stage 214, RF OUT 220, and Vbiases 222, 224, 226, and 228 in FIG. 2A.

Amplification module 300 includes output matching network 306, power amplifier 330, and input matching networks 332 and 334. Power amplifier 330 includes power amplifier input stages 308 and 310, power amplifier intermediate stage 312, and power amplifier output stage 314. Amplification module 300 can be used in wireless communication devices, such as cellular handsets, operating in systems using GSM, EDGE, CDMA, WCDMA, or other appropriate wireless communication standards.

As shown in FIG. 3A, RF input signal ("RF IN") 336 is coupled to the input of power amplifier input stage 308 via input matching network 332 and RF IN 338 is coupled to the input of power amplifier input stage 310 via input matching network 334. Input matching networks 332 and 334 can be configured to match the output impedances of circuits (not shown in FIG. 3A) that provide RF IN 336 and RFIN 338 to the input impedances of power amplifier input stages 308 and 310, respectively. It is noted that the inputs of power amplifier input stages 308 and 310 are also referred to as respective inputs of power amplifier 330 in the present application. Power amplifier 330 can be configured to receive and amplify RF IN 336 and generate RF OUT 320 in a first gain mode and to receive and amplify RF IN 338 and generate RF OUT 320 in a second gain mode. For example, the first gain mode can be a low gain mode and the second gain mode can be a high gain mode.

Power amplifier 330 can further be configured to operate as a linear power amplifier in a low gain mode and as a saturated power amplifier in a high gain mode. In a configuration where power amplifier input stage 310 has a greater gain than power amplifier input stage 308, power amplifier input stage 308 can be turned on in the low gain mode and power amplifier input stage 310 can be turned on in the high gain mode. For example, when power amplifier 330 is operating as a linear power amplifier in a low gain mode, RF IN 336 can comprise EDGE modulation, CDMA modulation, or other appropriate type of amplitude modulation. For example, when power amplifier 330 is operating as a saturated power amplifier in the high gain mode, RF IN 338 can comprise GMSK modulation or other appropriate type of phase modulation. Power amplifier 330 can be fabricated on a single semiconductor die using GaAs technology, BiCMOS technology, or other appropriate technology.

Further shown in FIG. 3A, Vbias 322 is coupled to a bias input of power amplifier input stage 308 and Vbias 324 is coupled to a bias input of power amplifier input stage 310. Power amplifier input stage 308 can be configured to receive and amplify RF IN 336 and generate an RF output signal at node 311 when power amplifier input stage 308 is turned on (i.e. activated) by Vbias 322. Analogously, power amplifier input stage 310 can be configured to receive and amplify RF IN 338 and generate an RF output signal at node 311 when power amplifier input stage 310 is turned on by Vbias 324. In the present embodiment, power amplifier input stage 310 can have a greater gain than power amplifier input stage 308. Vbias 322 can be turned on to activate power amplifier input stage 308 and cause power amplifier 330 to operate in a first gain mode, such as a low gain mode, and Vbias 324 can be turned on to activate power amplifier input stage 310 and cause power amplifier 330 to operate in a second gain mode, such as a high gain mode.

Also shown in FIG. 3A, the output of power amplifier input stage 308 is directly connected to the output of power amplifier input stage 310 at node 311. Further shown in FIG. 3A, the input of power amplifier intermediate stage 312 is coupled to node 311 and the output of power amplifier intermediate stage 312 is coupled to the input of power amplifier output stage 314. Also shown in FIG. 3A, the output of power amplifier stage 314, which is also referred to as the output of power amplifier 330, is coupled to output matching network 306 and provides RF OUT 320. Further shown in FIG. 3A, Vbias 326 is coupled to the bias input of power amplifier intermediate stage 312 and Vbias 328 is coupled to the bias input of power amplifier output stage 314.

The operation of power amplifier 330 will now be discussed. In a first gain mode, Vbias 324 is turned off and Vbias 322 is turned on, which turns on (i.e. activates) power amplifier input stage 308 and, thereby, causes power amplifier input stage 308 to receive and amplify RF IN 336. Thus, in the first gain mode, power amplifier 330 receives and amplifies RF IN 336 and generates RF OUT 320. In a second gain mode, Vbias 322 is turned off and Vbias 324 is turned on, which turns on (i.e. activates) power amplifier input stage 310 and, thereby, causes power amplifier input stage 310 to receive and amplify RF IN 338. Thus, in the second gain mode, power amplifier 330 receives and amplifies RF IN 338 and generates RF OUT 320. Thus, by appropriately turning each of Vbiases 322 and 324 on or off, either power amplifier input stage 308 can be selectively activated to amplify RF IN 336 or power amplifier input stage 310 can be selectively activated to amplify RF IN 338.

The embodiment in FIG. 3A provides similar advantages as the embodiment in FIG. 2A discussed above. Additionally, in the embodiment in FIG. 3A, power amplifier 330 can independently amplify either RF IN 336 by activating power amplifier input stage 308 by turning on Vbias 322 or RF IN 338 by activating power amplifier input stage 310 by turning on Vbias 324. In other embodiments, more than two power amplifier input stages can have their outputs directly connected at node 311, where each power amplifier input stage is coupled to a different RF input signal and controlled by a different bias voltage.

Figure 3B:
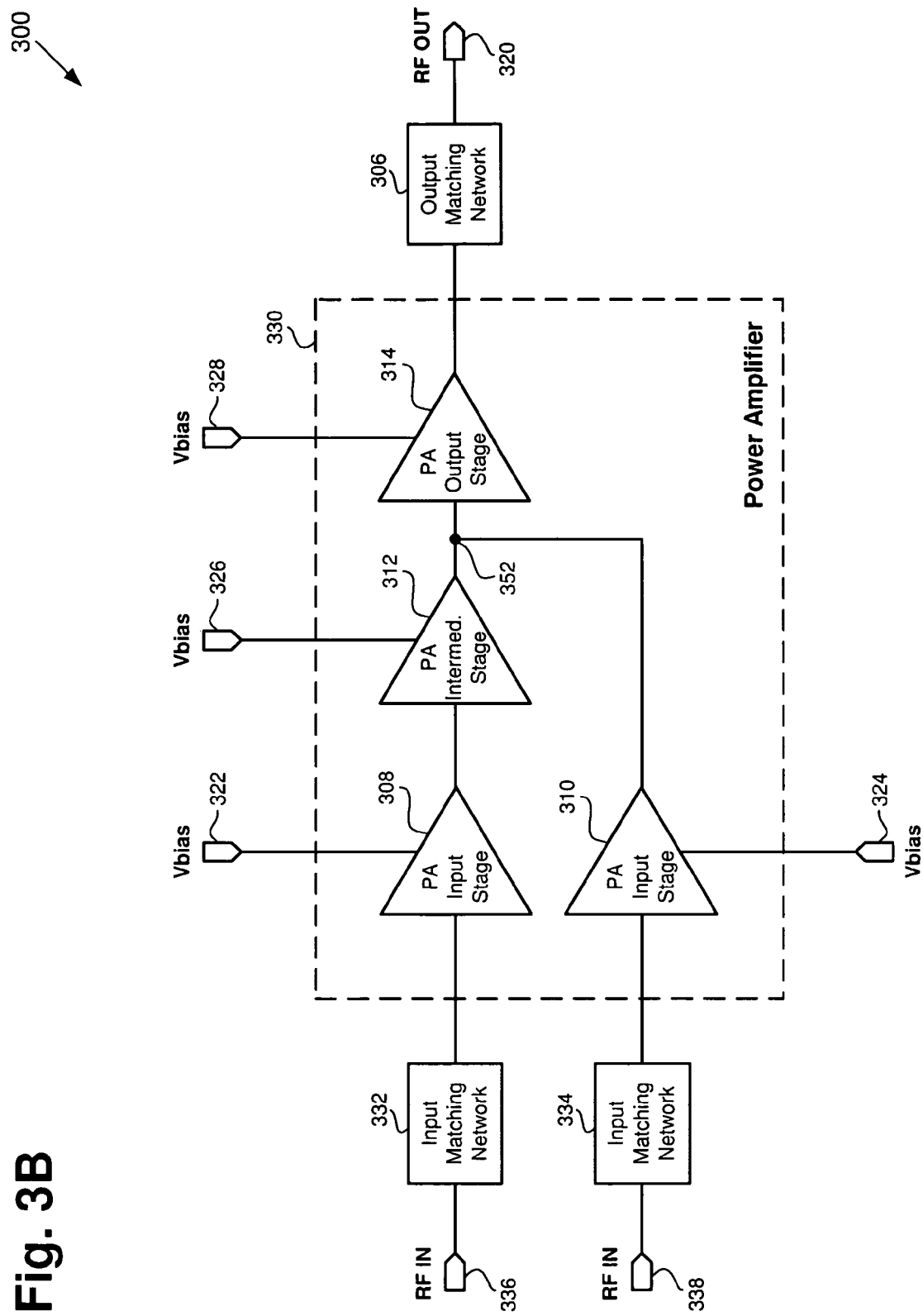
FIG. 3B is a block diagram of an exemplary amplification module including an exemplary power amplifier in accordance with another embodiment of the present invention.

FIG. 3B shows another embodiment of the invention, analogous to the embodiment in FIG. 3A. In the embodiment shown in FIG. 3B, in contrast with the embodiment of FIG. 3A, output of power amplifier input stage 310 is not coupled to output of power amplifier input stage 308. Instead, output of power amplifier input stage 310 is coupled to output of power amplifier intermediate stage 312 at node 352. In addition to all the advantages described above with respect to the embodiment of FIG. 3A, in the embodiment of FIG. 3B, power amplifier 330 can be converted from a three stage amplifier to a two stage amplifier. More generally, two stages in power amplifier 330 can be converted to a single stage, resulting in a power amplifier with one fewer stage. Similar to the embodiment in FIG. 3A, input stage 308 and intermediate stage 312 can be switched off by turning off Vbias 322 and Vbias 326, while input stage 310 can be turned on by turning on Vbias 324. Thus, in addition to the advantages described in relation to the embodiment of FIG. 3A, the embodiment of FIG. 3B will result in additional flexibility in that a power amplifier with one fewer gain stage is created, thus providing additional control over the gain characteristics of the power amplifier.

Thus, as discussed above, the various embodiments of the present invention provide a power amplifier having two gain modes, such as low and high gain modes, which can be selected by appropriately activating selected amplifier gain stages by turning on or turning off respective bias voltages. Also, by turning on bias voltages to activate power amplifier gain stages in respective first and second gain modes, the present invention advantageously allows the first or second gain modes to be selected without utilizing a switch. As a result, the present invention advantageously provides a dual gain power amplifier having reduced loss, noise, and manufacturing cost compared to conventional power amplifier 102 in FIG. 1, which utilizes switch 114 to select a low gain or a high gain mode.

Furthermore, the present invention advantageously achieves a dual gain power amplifier that requires a reduced number of blocking components, such as blocking capacitors and inductors, compared to a conventional power amplifier that utilizes a switch for selecting a low or high gain mode, which further reduces manufacturing cost. Moreover, the present invention achieves a dual gain mode power amplifier that can be advantageously fabricated on a single semiconductor die.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a dual mode power amplifier has been described.

The invention claimed is:

1. A power amplifier configured to operate in first and second gain modes, said power amplifier comprising:
   a first input stage being selectively turned on and turned off by a first bias voltage;
   a second input stage being selectively turned on and turned off by a second bias voltage;
   an intermediate stage driven by said first input stage, said intermediate stage being selectively turned on and turned off by a third bias voltage;
   said intermediate stage and said second input stage sharing a common output;
   wherein said first input stage and said intermediate stage are turned on and said second input stage is turned off in said first gain mode;
   wherein said first input stage and said intermediate stage are turned off and said second input stage is turned on in said second gain mode;
   wherein said common output is made by a direct connection between an output of said second input stage and an output of said intermediate stage.

2. The power amplifier of claim 1 wherein a gain of said power amplifier is greater in said first gain mode than in said second gain mode.

3. The power amplifier of claim 1 wherein a gain of said power amplifier in said first gain mode is equal to said gain of said power amplifier in said second gain mode.

4. The power amplifier of claim 1 wherein an input of said first input stage is coupled to an input of said second input stage.

5. The power amplifier claim 1 wherein an input of said first input stage is directly connected to an input of said second input stage.

6. The power amplifier of claim 1 being further configured to a receive a first RF signal in said first gain mode and a second RF signal in said second gain mode, wherein said first RF signal is coupled to an input of said first input stage and said second RF signal is coupled to an input of said second input stage.

7. The power amplifier of claim 1 being further configured to operate as a saturated power amplifier in said first gain mode and to operate as a linear power amplifier in said second gain mode.

8. The power amplifier of claim 1 being further configured to operate as a linear power amplifier in said first gain mode and to operate as a linear power amplifier in said second gain mode.

9. The power amplifier of claim 1 being further configured to operate as a saturated power amplifier in said first gain mode and to operate as a saturated power amplifier in said second gain mode.

10. The power amplifier of claim 6 wherein said first RF signal comprises EDGE modulation and said second RF signal comprises GMSK modulation.

11. The power amplifier of claim 1 wherein said power amplifier is fabricated on a single semiconductor die.

12. An amplification module comprising:
   a power amplifier configured to operate in a first gain mode and a second gain mode;
   said power amplifier comprising a first power amplifier input stage, said first power amplifier input stage having an input and an output;
   said power amplifier further comprising a second power amplifier input stage, said second power amplifier input stage having an input and an output, said output of said second power amplifier input stage being coupled to said output of said first power amplifier input stage;
   wherein said first power amplifier input stage is activated in response to a first bias voltage in said first gain mode and said second power amplifier input stage is activated in response to a second bias voltage in said second gain mode, wherein said second power amplifier input stage is turned off when said first power amplifier input stage is activated and said first power amplifier input stage is turned off when said second power amplifier input stage is activated;
   wherein said power amplifier is further configured to a receive a first RF input signal in said first gain mode and a second RF input signal in said second gain mode and provide an RF output signal, wherein said first RF input signal is coupled to said input of said first power amplifier input stage and said second RF input signal is coupled to said input of said second power amplifier input stage.

13. The amplification module of claim 12 wherein said first power amplifier input stage has a first gain and said second power amplifier input stage has a second gain, wherein said second gain is greater than said first gain.

14. The amplification module of claim 12 wherein said first power amplifier input stage has a first gain and said second power amplifier input stage has a second gain, wherein said first gain is equal to said second gain.

15. The amplification module of claim 12 wherein said output of said first power amplifier input stage is directly connected to said output of said second power amplifier input stage.

16. The amplification module of claim 12 wherein said input of said first power amplifier input stage is coupled to said input of said second power amplifier input stage.

17. The amplification module of claim 12 wherein said input of said first power amplifier input stage is directly connected to said input of said second power amplifier input stage.

18. The amplification module of claim 12 wherein said power amplifier is further configured to operate as a linear power amplifier in said first gain mode and to operate as a saturated power amplifier in said second gain mode.

19. The amplification module of claim 12 wherein said power amplifier is further configured to operate as a linear power amplifier in said first gain mode and to operate as a linear power amplifier in said second gain mode.

20. The amplification module of claim 12 wherein said power amplifier is further configured to operate as a saturated power amplifier in said first gain mode and to operate as a saturated power amplifier in said second gain mode.

21. The amplification module of claim 12 wherein said first RF input signal comprises EDGE modulation and said second RF input signal comprises GMSK modulation.

22. The amplification module of claim 12 wherein said power amplifier is fabricated on a single semiconductor die.

23. A power amplifier configured to operate in first and second gain modes, said power amplifier comprising:
- a first input stage being selectively turned on and turned off by a first bias voltage;
- a second input stage being selectively turned on and turned off by a second bias voltage;
- an intermediate stage driven by said first input stage, said intermediate stage being selectively turned on and turned off by a third bias voltage;
- said intermediate stage and said second input stage sharing a common output;
- wherein said first input stage and said intermediate stage are turned on and said second input stage is turned off in said first gain mode;
- wherein said first input stage and said intermediate stage are turned off and said second input stage is turned on in said second gain mode;
- wherein said power amplifier is further configured to a receive a first RF signal in said first gain mode and a second RF signal in said second gain mode, wherein said first RF signal is coupled to an input of said first input stage and said second RF signal is coupled to an input of said second input stage.

24. The power amplifier of claim 23 wherein said first RF signal comprises EDGE modulation and said second RF signal comprises GMSK modulation.

* * * * *